US008780574B2

(12) United States Patent
Wu

(10) Patent No.: US 8,780,574 B2
(45) Date of Patent: Jul. 15, 2014

(54) DOUBLE-SIDED PRINTED CIRCUIT BOARD

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 145 days.

(21) Appl. No.: 13/239,287

(22) Filed: Sep. 21, 2011

(65) Prior Publication Data

US 2013/0021767 A1    Jan. 24, 2013

(30) Foreign Application Priority Data

Jul. 21, 2011  (TW) .............................. 100125765 A

(51) Int. Cl.
*H01R 9/00* (2006.01)
*H05K 7/00* (2006.01)

(52) U.S. Cl.
USPC ............ 361/776; 361/760; 361/807; 361/810

(58) Field of Classification Search
USPC .......... 361/760, 776, 807, 810, 765; 174/260, 174/255, 254
See application file for complete search history.

(56) References Cited

U.S. PATENT DOCUMENTS

| 4,639,830 | A  | * | 1/1987 | Fukuoka | 361/779 |
| 5,386,342 | A  | * | 1/1995 | Rostoker | 361/749 |
| 6,545,227 | B2 | * | 4/2003 | Silverman | 174/260 |
| 7,102,240 | B2 | * | 9/2006 | Park et al. | 257/778 |
| 2012/0037935 | A1 | * | 2/2012 | Yang | 257/98 |

* cited by examiner

*Primary Examiner* — Jayprakash N Gandhi
*Assistant Examiner* — Dion Ferguson
(74) *Attorney, Agent, or Firm* — Novak Druce Connolly Bove + Quigg LLP

(57) ABSTRACT

A double-sided PCB includes a circuit plate, a first chip, and a second chip. The circuit plate includes a spacer layer having a first surface and an opposing second surface, a first multilayer structure, and a second multilayer structure. The first multilayer structure includes a first wire layer, a first middle layer, and a second wire layer having a first grounding portion and first conductive pattern portions, that are stacked on each other on the first surface. The second multilayer structure on the second surface is either a mirror image of the first multilayer structure, or is very similar thereto. The first and second chips are each arranged on a grounding portion and are each electrically connected to their respective conductive pattern portions.

7 Claims, 9 Drawing Sheets

DOUBLE-SIDED PRINTED CIRCUIT BOARD

BACKGROUND

1. Technical Field

The present disclosure relates to a double-sided printed circuit board (PCB).

2. Description of Related Art

Single-sided PCBs in which a circuit pattern(s) is formed on only one side of an insulating substrate, are widely used for carrying various electronic components, such as capacitors, resistors, or inductors, as these electronic components generally have simple structures and their circuit patterns are not complicated. However, there is a demand for electronic devices to be faster and have more functions, requiring more electronic components on the PCB. Hence, miniaturization and a higher degree of integration on the PCB are of great importance.

DETAILED DESCRIPTION

Figure 1:
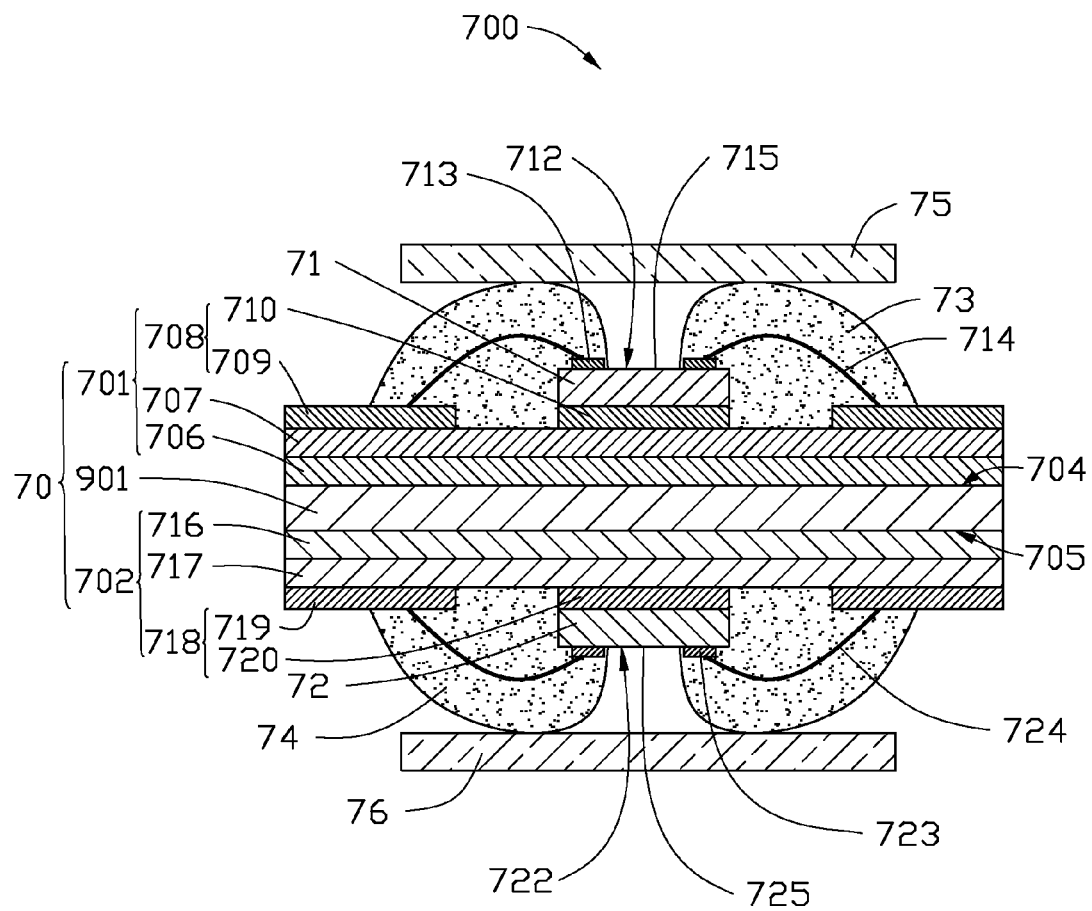
FIG. 1 is a sectional view of a double-sided PCB including cover glasses, according to a first exemplary embodiment.
Figure 2:
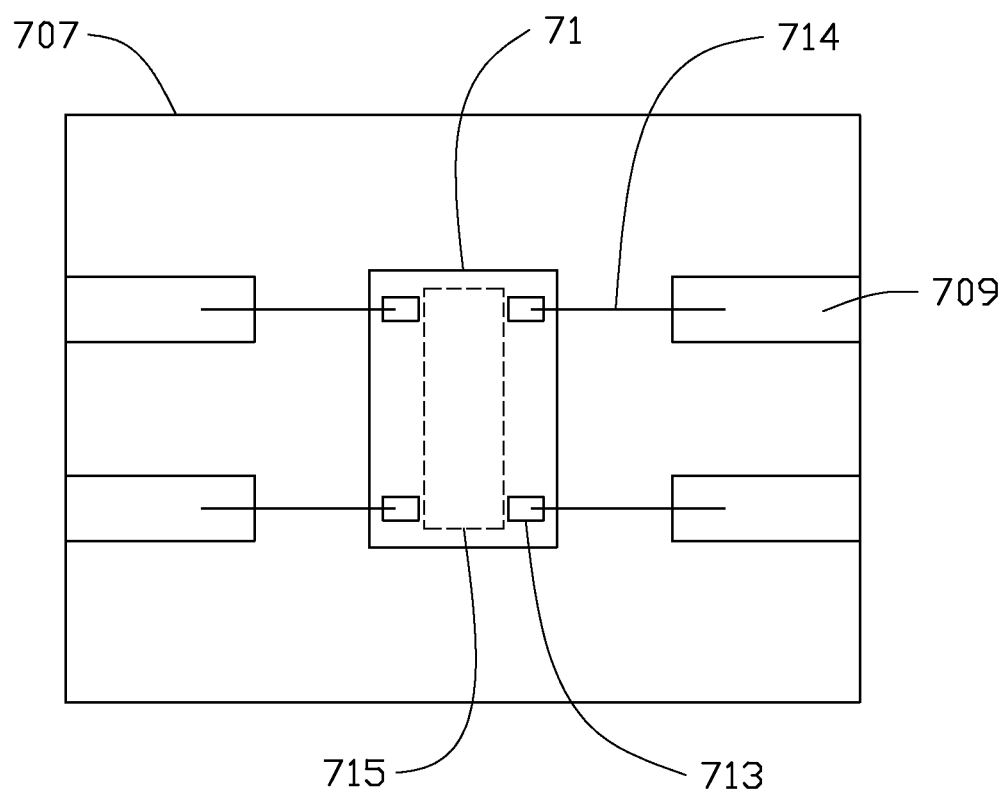
FIG. 2 is a top view of the double-sided PCB of FIG. 1, after removing the cover glasses.

Referring to FIGS. 1-2, a double-sided PCB 700, according to a first exemplary embodiment, includes a circuit plate 70, a first chip 71, a second chip 72, a first protective layer 73, a second protective layer 74, a first cover glass 75, and a second cover glass 76. The first chip 71 and the second chip 72 are integrated circuit microchips.

The circuit plate 70 includes a spacer layer 901, a first multilayer structure 701, and a second multilayer structure 702. The spacer layer 901 includes a first surface 704 and a second surface 705. The first surface 704 and the second surface 705 are positioned at opposite sides of the spacer layer 901. The first multilayer structure 701 is arranged on the first surface 704. The second multilayer structure 702 is arranged on the second surface 705. In this embodiment, the spacer layer 901 is made of a ceramic material.

The first multilayer structure 701 includes a first wire layer 706 arranged on the first surface 704, a first middle layer 707 arranged on the first wire layer 706, and a second wire layer 708 arranged on the first middle layer 707. The first middle layer 707 may be a single insulating layer or a multilayer structure including a conductive layer and an insulating layer that are alternately stacked. The second wire layer 708 includes four independently-conductive traces or lines (first conductive pattern portions 709) and a first grounding portion 710. The first grounding portion 710 is made of metal.

The second multilayer structure 702 includes a third wire layer 716 arranged on the second surface 705, a second middle layer 717 arranged on the third wire layer 716, and a fourth wire layer 718 arranged on the second middle layer 717. The second middle layer 717 may be a single insulating layer or a multilayer structure including a conductive layer and an insulating layer that are alternately stacked. The fourth wire layer 718 includes four second conductive pattern portions 719 and a second grounding portion 720. The second grounding portion 720 is made of metal.

The first chip 71 is electrically mounted on the first grounding portion 710. The first grounding portion 710 can enhance the heat dissipation from the first chip 71 and shield against electromagnetic interference between the first chip 71 and other electronic components. The other electronic components may be on either side of the double-sided PCB(s) 700. The first chip 71 may be physically secured to the first grounding portion 710 by an insulating adhesive.

The first chip 71 includes a first top surface 712 and four first chip pads 713 formed on the first top surface 712. The four first chip pads 713 are electrically connected respectively to the four first conductive pattern portions 709 via four first wires 714. A first chip pad 713 corresponds to a first conductive pattern portion 709 and to a first wire 714. The first wires 714 may be formed on the four first chip pads 713 and the four first conductive pattern portions 709 by a wire bonding method. The first wires 714 may be made of gold, aluminum, copper, or any alloy thereof. In this embodiment, the four first conductive pattern portions 709 are divided into two pairs. One pair of the first conductive pattern portions 709 is arranged on one side of the first middle layer 707, and the other pair of the first conductive pattern portions 709 is arranged on the opposing side of the first middle layer 707, and the two pairs of the first conductive pattern portions 709 are symmetrical relative to the first chip 71.

The material of the first protective layer 73 may be heat-curable, such as polyimide resin, epoxy resin, silicone resin or the like. The first protective layer 73 covers the first wires 714, the jointed portions between the first wires 714 and the corresponding first chip pads 713, and the jointed portions between the first wires 714 and the corresponding first conductive pattern portions 709. The first protective layer 73 is to strengthen the connections between the first wires 714 and the corresponding first chip pads 713, and between the first wires 714 and the corresponding first conductive pattern portions 709, and enhance the anti-oxidation tendencies of the first wires 714, the first chip pads 713, and the first conductive pattern portions 709, to prolong the working life of the double-sided PCB 700.

In this embodiment, the first top surface 712 includes a first exposed region 715. The first exposed region 715 is free of the first protective layer 73 and faces the first cover glass 75. When the first chip 71 is a laser diode, the first exposed region 715 corresponds to the light emitting region of the laser diode.

The first cover glass 75 is attached to the first protective layer 73 and seals the first chip 71 against penetration by dust, water vapor, or other contaminants.

The second chip 72 is electrically mounted on the second grounding portion 720. The second grounding portion 720 can enhance the heat dissipation from the second chip 72 and shield against any electromagnetic interference between the second chip 72 and other electronic components. The second chip 72 may be physically secured in the same manner as the first chip 71, and the materials, layout, and connections and potential connections on the side of the PCB 700 to which the chip 72 is mounted are, mutatis mutandis, the same as those on the reverse side.

In detail, the second chip 72 includes a second top surface 722 and four second chip pads 723 formed on the second top surface 722. The four second chip pads 723 are electrically connected respectively to the four second conductive pattern portions 719 via four second wires 724. A second chip pad 723 corresponds to a second conductive pattern portion 719 and to a second wire 724. The second wires 724 may be formed on the four second chip pads 723 and the four second conductive pattern portions 719 by a wire bonding method. The second wires 724 may be made of gold, aluminum, copper, or any alloy thereof. In this embodiment, the four second conductive pattern portions 719 are divided into two pairs. One pair of the second conductive pattern portions 719 is arranged on one side of the second middle layer 717, and the other pair of the second conductive pattern portions 719 is arranged on the opposing side of the second middle layer 717, and the two pairs of the second conductive pattern portions 719 are symmetrical relative to the second chip 72.

The material of the second protective layer 74 may be heat-curable, such as polyimide resin, epoxy resin, silicone resin or the like. The second protective layer 74 covers the second wires 724, the jointed portions between the second wires 724 and the corresponding second chip pads 723, and the jointed portions between the second wires 724 and the corresponding second conductive pattern portions 719. The second protective 74 is to strengthen the connections between the second wires 724 and the corresponding first chip pads 723, and between the second wires 724 and the corresponding second conductive pattern portions 719, and enhance anti-oxidation tendencies of the second wires 724, the second chip pads 723, and the second conductive pattern portions 719, to prolong the working life of the double-sided PCB 700.

In this embodiment, the second top surface 722 includes a second exposed region 725. The second exposed region 725 is free of the second protective layer 74 and faces the second cover glass 76. When the second chip 72 is a photo diode, the second exposed region 725 corresponds to the light receiving region of the photo diode.

The second cover glass 76 is attached to the second protective layer 74 and seals the second chip 72 against prevent penetration by dust, water vapor, or other contaminants.

In this double-sided PCB 700, the electronic components, such as the first chip 71 and the second chip 72, can be positioned either on the surface 704 or on the surface 705 of the spacer layer 901, and the depth or thickness of the double-sided PCB 700 is not changed. Therefore, the integration potential of the double-sided PCB 700 is higher. In addition, although this double-sided PCB 700 is thicker or deeper, the increased thickness or depth is balanced by decreases in the overall length and width, or simply by a denser integration for the same overall length and width. The double-sided PCB 700 is more compact.

Figure 3:
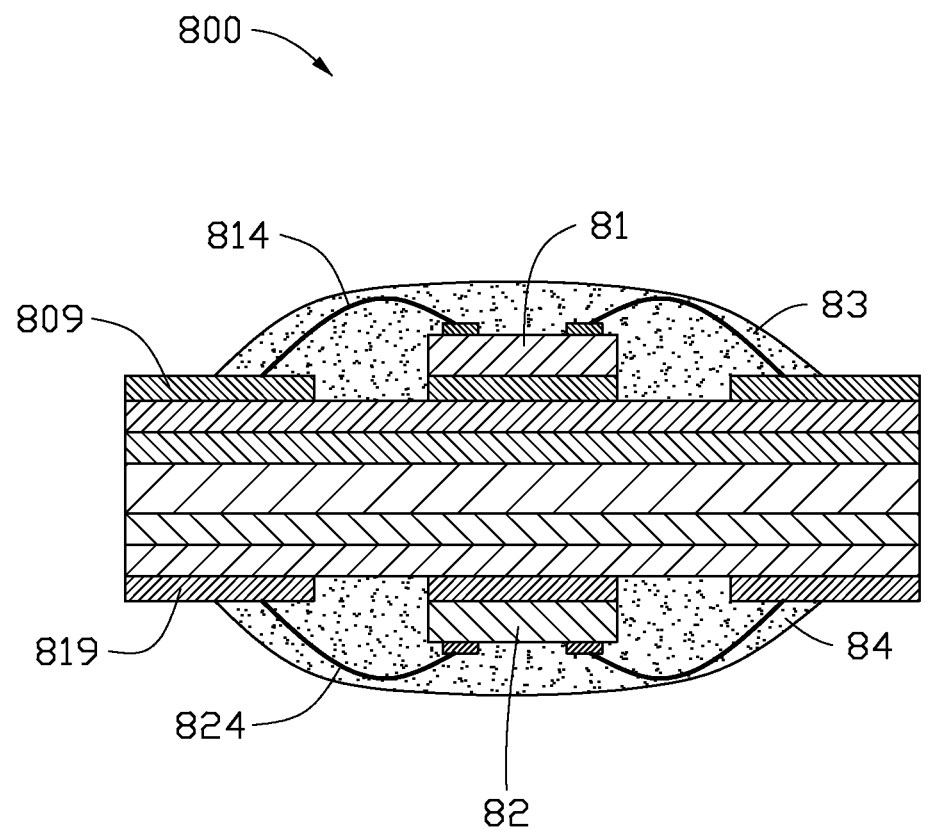
FIG. 3 is a sectional view of a double-sided PCB, according to a second exemplary embodiment.

Referring to FIGS. 1 and 3, a double-sided PCB 800, according to a second exemplary embodiment, is shown. The differences between the double-sided PCB 800 of this embodiment and the double-sided PCB 700 of the first embodiment are: the first protective layer 83 covers the entire first chip 81, the first wires 814, and the jointed portions between the first wires 814 and the corresponding first conductive pattern portions 809. The second protective layer 84 covers the entire second chip 82, the second wires 824, and the jointed portions between the second wires 824 and the corresponding second conductive pattern portions 819. The first and second cover glasses are omitted.

The advantages of the second embodiment are similar to those of the first embodiment. Further, since the first and second cover glasses are omitted, the height of the double-sided PCB 800 is reduced, and the light transmitting efficiency of the first and second chips 81, 82 is increased. Therefore, the double-sided PCB 800 is more compact by a factor of more than one.

Figure 4:
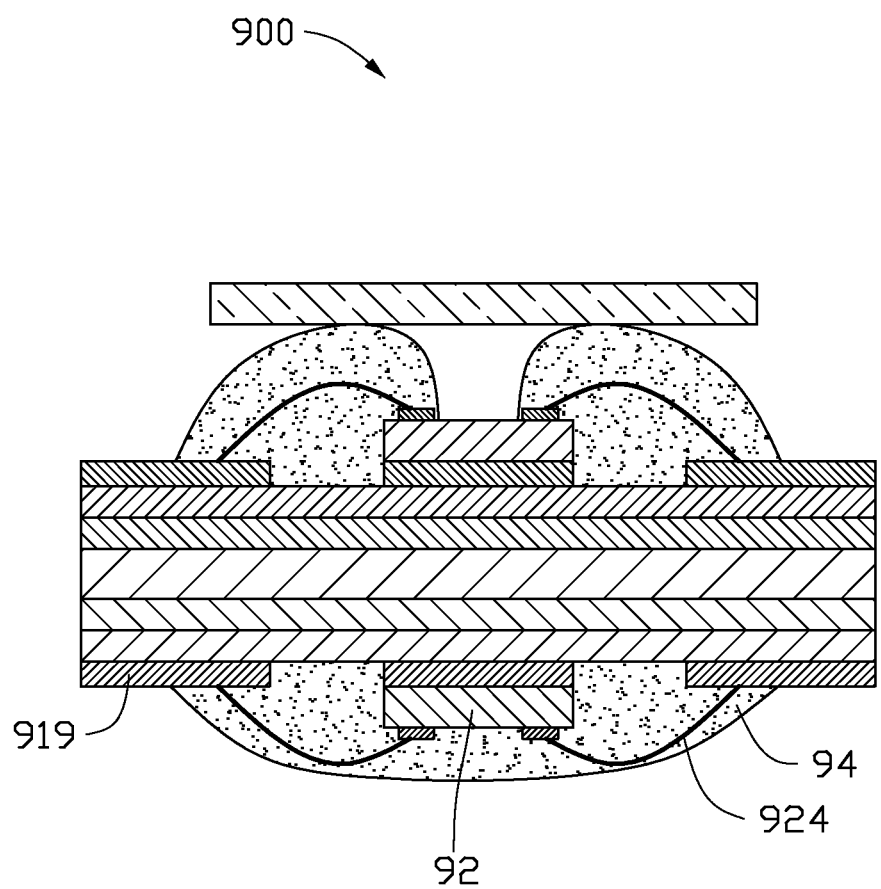
FIG. 4 is a sectional view of a double-sided PCB, according to a third exemplary embodiment.

Referring to FIGS. 1 and 4, a double-sided PCB 900, according to a third exemplary embodiment, is shown. The differences between the double-sided PCB 900 of this embodiment and the double-sided PCB 700 of the first embodiment are: the second protective layer 94 covers the entire second chip 92, the second wires 924, and the jointed portions between the second wires 924 and the corresponding second conductive pattern portions 919. The second cover glass is omitted.

The advantages of the third embodiment are similar to those of the second embodiment.

Figure 5:
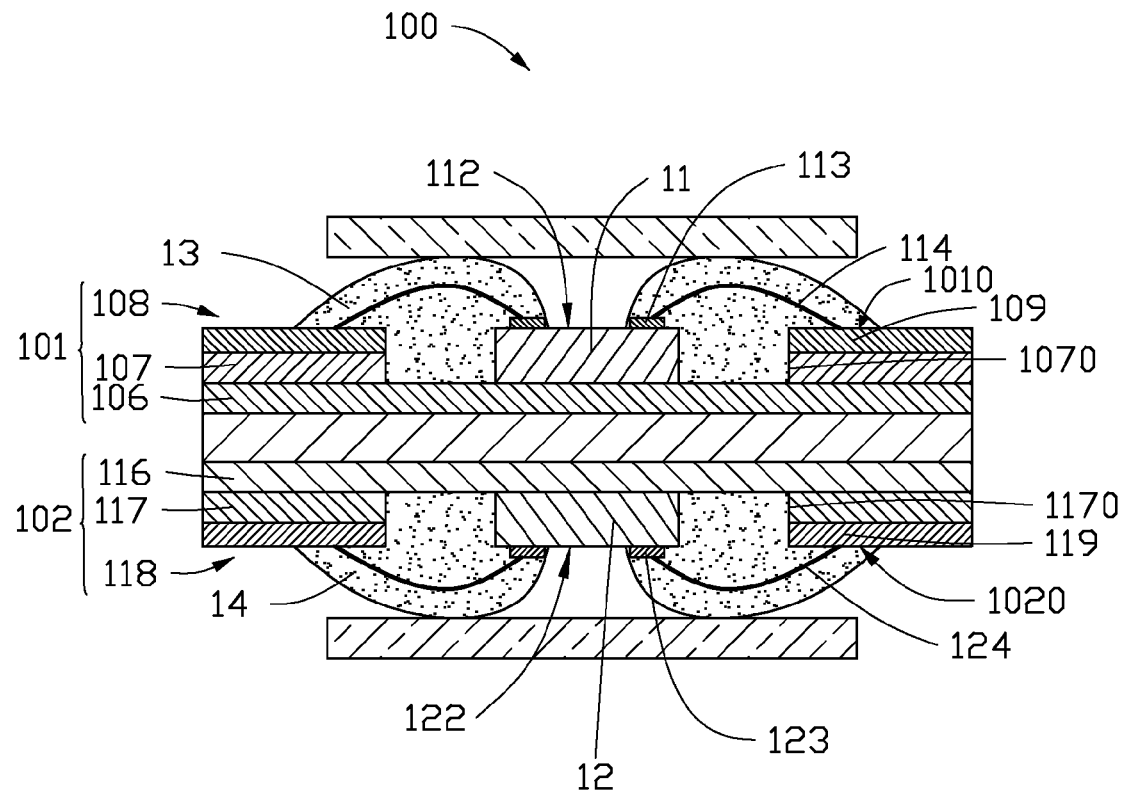
FIG. 5 is a sectional view of a double-sided PCB, according to a fourth exemplary embodiment.

Referring to FIGS. 1 and 5, a double-sided PCB 100, according to a fourth exemplary embodiment, is shown. The differences between the double-sided PCB 100 of this embodiment and the double-sided PCB 700 of the first embodiment are: the first wire layer 106 is grounded. The first middle layer 107 defines a first through hole 1070. The second wire layer 108 omits the first grounding portion and includes four first conductive pattern portions 109. The four first conductive pattern portions 109 are arranged on the first middle layer 107 around the first through hole 1070. The first chip 11 is received in the first through hole 1070 and arranged on the first wire layer 106. The top surface 1010 of the first multilayer structure 101 is coplanar with the first top surface 112 of the first chip 11. The first protective layer 13 covers the first wires 114, the jointed portions between the first wires 114 and the corresponding first chip pads 113, the jointed portions between the first wires 114 and the corresponding first conductive pattern portions 109, and the entire first through hole 1070.

The third wire layer 116 is grounded. The second middle layer 117 defines a second through hole 1170. The fourth wire layer 118 omits the second grounding portion and includes four second conductive pattern portions 119. The four second conductive pattern portions 119 are arranged on the second middle layer 117 around the second through hole 1170. The second chip 12 is received in the second through hole 1170 and arranged on the third wire layer 116. The top surface 1020 of the second multilayer structure 102 is coplanar with the second top surface 122 of the second chip 12. The second protective layer 14 covers the second wires 124, the jointed portions between the second wires 124 and the corresponding second chip pads 123, the jointed portions between the second wires 124 and the corresponding second conductive pattern portions 119, and the entire second through hole 1170.

The advantages of the fourth embodiment are similar to those of the first embodiment. Further, since the first chip 11 is received in the first through hole 1070, and the second chip 12 is received in the second through hole 1170, the difference in heights between the first conductive pattern portion 109 and the corresponding first chip pad 113, and between the second conductive pattern portion 119 and the corresponding second chip pad 123, is reduced. Therefore, the first and second wires 114, 124 are shortened so as to minimize any inductive effect of the first and second wires 114, 124 and to reduce the amount of material needed for the first and second wires 114, 124.

Figure 6:
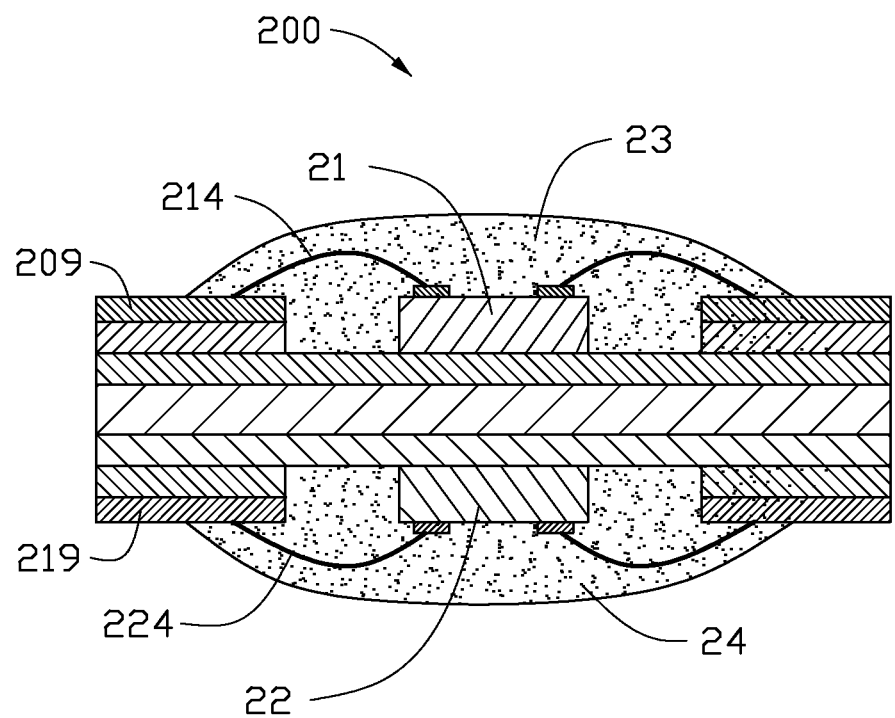
FIG. 6 is a sectional view of a double-sided PCB, according to a fifth exemplary embodiment.

Referring to FIGS. 5 and 6, a double-sided PCB 200, according to a fifth exemplary embodiment, is shown. The differences between the double-sided PCB 200 of this embodiment and the double-sided PCB 100 of the fourth embodiment are: the first protective layer 23 covers the entire first chip 21, the first wires 214, and the jointed portions between the first wires 214 and the corresponding first conductive pattern portions 209. The second protective layer 24 covers the entire second chip 22, the second wires 224, and the jointed portions between the second wires 224 and the corresponding second conductive pattern portions 219. The first and second cover glasses are omitted.

The advantages of the fifth embodiment are similar to those of the fourth embodiment. Further, since the first and second cover glasses are omitted in this embodiment, the height of the double-sided PCB 200 is reduced, and the light transmitting efficiency of the first and second chips 21, 22 is increased. Therefore, the double-sided PCB 200 again is more compact.

Figure 7:
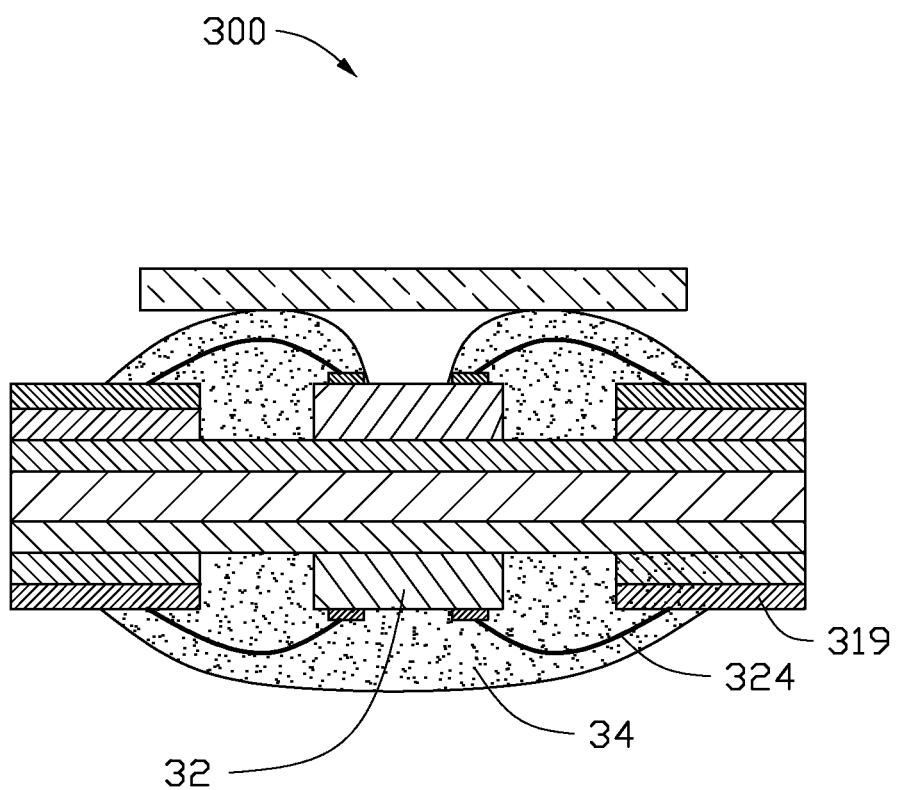
FIG. 7 is a sectional view of a double-sided PCB, according to a sixth exemplary embodiment.

Referring to FIGS. 5 and 7, a double-sided PCB 300, according to a sixth exemplary embodiment, is shown. The differences between the double-sided PCB 300 of this embodiment and the double-sided PCB 100 of the fourth embodiment are: the second protective layer 34 covers the entire second chip 32, the second wires 324, and the jointed portions between the second wires 324 and the corresponding second conductive pattern portions 319. The second cover glass is omitted.

The advantages of the sixth embodiment are similar to those of the fifth embodiment.

Figure 8:
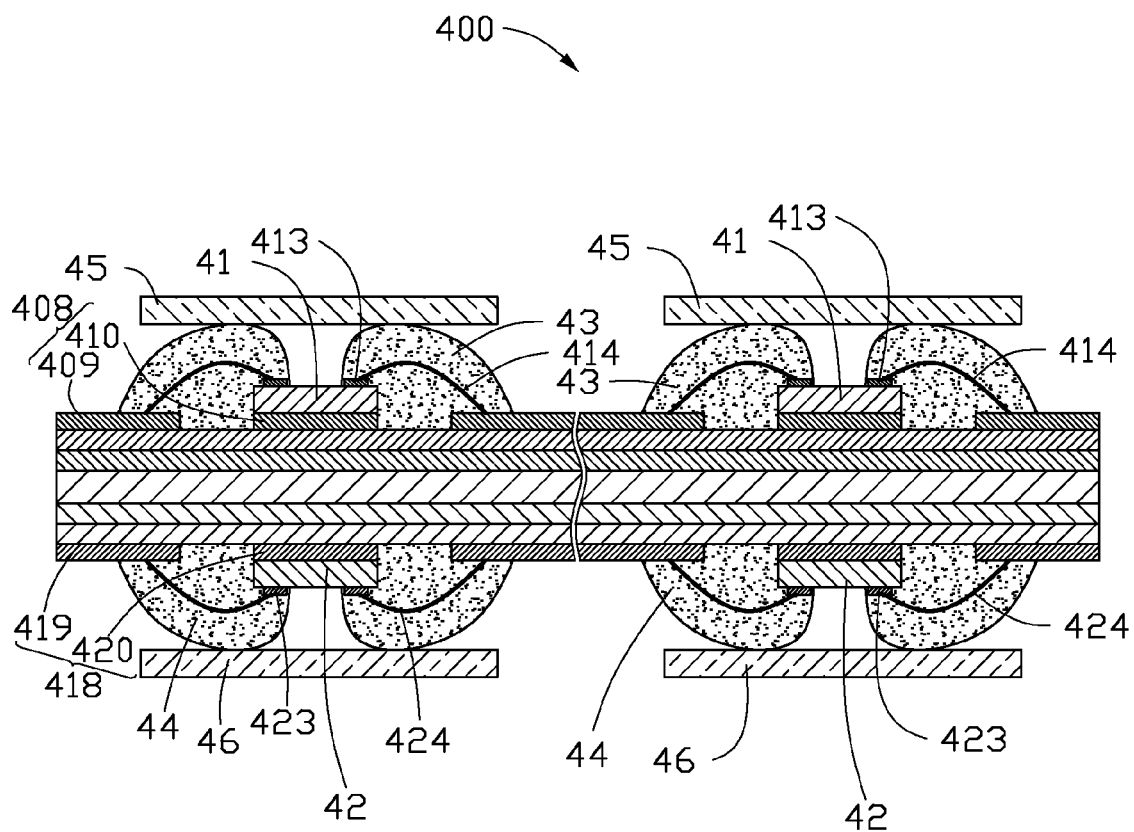
FIG. 8 is a sectional view of a double-sided PCB, according to a seventh exemplary embodiment.

Referring to FIGS. 1 and 8, a double-sided PCB 400, according to a seventh exemplary embodiment, is shown. The differences between the double-sided PCB 400 of this embodiment and the double-sided PCB 700 of the first embodiment are: the double-sided PCB 400 includes two first chips 41, two second chips 42, two first protective layers 43, two second protective layers 44, two first cover glasses 45, two second cover glasses 46, eight first wires 414, and eight second wires 424. The second wire layer 408 includes eight first conductive pattern portions 409 and two first grounding portions 410. The fourth wire layer 418 includes eight second conductive pattern portions 419 and two second grounding portions 420. Every four first conductive pattern portions 409 respectively correspond to one first grounding portion 410, one first chip 41, four first chip pads 413, four first wires 414, a first protective layer 43, and a first cover glass 45, and the arrangements in relation to these items are similar to those in the first embodiment. Every four second conductive pattern portions 419 respectively correspond to one second grounding portion 420, one second chip 42, four second chip pads 423, four second wires 424, a second protective layer 44, and a second cover glass 46, and the arrangements in relation to these items are similar to those in the first embodiment.

In this embodiment, the two first chips 41 are laser diodes, and the two second chips 43 are photo diodes. In other embodiments, one of the first chips 41 may be a laser diode, and the other one of the first chips 41 may be a photo diode. One of the second chips 43 may be a laser diode, and the other one of the second chips 43 may be a photo diode.

Figure 9:
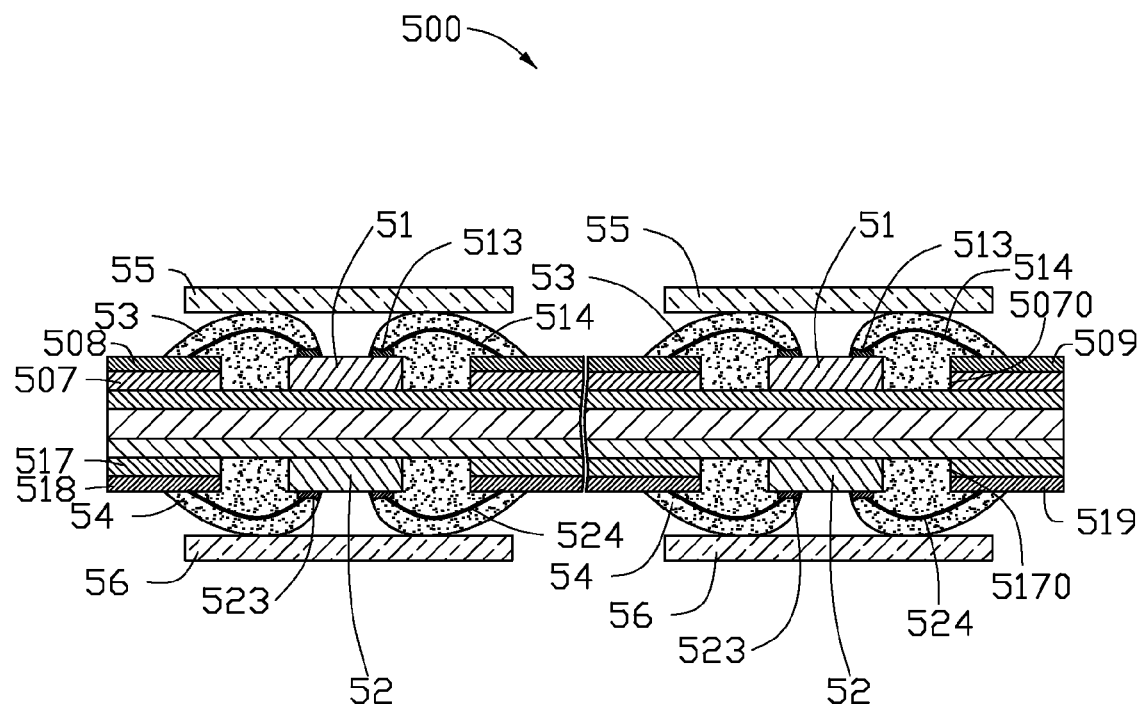
FIG. 9 is a sectional view of a double-sided PCB, according to an eighth exemplary embodiment.

Referring to FIGS. 1 and 9, a double-sided PCB 500, according to an eight exemplary embodiment, is shown. The differences between the double-sided PCB 500 of this embodiment and the double-sided PCB 100 of the fourth embodiment are: the double-sided PCB 500 includes two first chips 51, two second chips 52, two first protective layers 53, two second protective layers 54, two first cover glasses 55, two second cover glasses 56, eight first wires 514, and eight second wires 524. The second wire layer 508 includes eight first conductive pattern portions 509. The first middle layer 507 defines two first through holes 5070. The fourth wire layer 518 includes eight second conductive pattern portions 519. The second middle layer 517 defines two second through holes 5170. Every four first conductive pattern portions 509 respectively correspond to one first through hole 5070, one first chip 51, four first chip pads 513, four first wires 514, a first protective layer 53, and a first cover glass 55, and the arrangements in relation to these items are similar to those in the fourth embodiment. Every four second conductive pattern portions 519 respectively correspond to one second through hole 5170, one second chip 52, four second chip pads 523, four second wires 524, a second protective layer 54, and a second cover glass 56, and the arrangements in relation to these items are similar to those of the first embodiment.

In this embodiment, the two first chips 51 are laser diodes, and the two second chips 53 are photo diodes. In other embodiments, one of the first chips 51 may be a laser diode, and the other one of the first chips 51 may be a photo diode. One of the second chips 53 may be a laser diode, and the other one of the second chips 53 may be a photo diode.

The advantages of the seventh embodiment are similar to those of the first embodiment, and the advantages of the eighth embodiment are similar to those of the fourth embodiment.

Although numerous characteristics and advantages of the present embodiments have been set forth in the foregoing description, together with details of the structures and functions of the embodiments, the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A double-sided printed circuit board comprising:
a circuit plate comprising:
  a spacer layer comprising a first surface and an opposing second surface;
  a first multilayer structure arranged on the first surface, the first multilayer structure comprising a first wire layer formed on the first surface, a first middle layer formed on the first wire layer, and a second wire layer formed on the first middle layer, the second wire layer comprising a first grounding portion and a plurality of first conductive pattern portions; and
  a second multilayer structure arranged on the second surface, the second multilayer structure comprising a third wire layer formed on the second surface, a second middle layer formed on the third wire layer, and a fourth wire layer formed on the second middle layer, the fourth wire layer comprising a second grounding portion and a plurality of second conductive pattern portions;
a first chip electrically mounted on the first grounding portion and electrically connected to the first conductive pattern portions;
a second chip electrically mounted on the second grounding portion and electrically connected to the second conductive pattern portions;
a plurality of first wires and a plurality of second wires, wherein the first chip comprises a first top surface and a plurality of first chip pads formed on the first top surface, the second chip comprises a second top surface and a plurality of second chip pads formed on the second top surface, the first chip pads are connected to the respective first conductive pattern portions through the first wires, and the second chip pads are connected to the respective second conductive pattern portions through the second wires; and
a first protective layer and a second protective layer, wherein the first protective layer covers the first wires, the jointed portions between the first wires and the corresponding first chip pads, and the jointed portions between the first wires and the corresponding first conductive pattern portions, the first top surface comprises a first exposed region among the first chip pads and being free of the first protective layer, the second protective layer covers the second wires, the jointed portions between the second wires and the corresponding second chip pads, and the jointed portions between the second wires and the corresponding second conductive pattern portions, and the second top surface comprises a second exposed region among the second chip pads and being free of the second protective layer.

2. The double-sided printed circuit board as claimed in claim 1, further comprising a first cover glass and a second cover glass, wherein the first cover glass is attached to the first protective layer and seals the first chip, the first exposed region faces the first cover glass, the second cover glass is attached to the second protective layer and seals the second chip, and the second exposed region faces the second cover glass.

3. A double-sided printed circuit board comprising:
   a circuit plate comprising:
      a spacer layer comprising a first surface and an opposing second surface;
      a first multilayer structure arranged on the first surface, the first multilayer structure comprising a first wire layer formed on the first surface, a first middle layer formed on the first wire layer, and a second wire layer formed on the first middle layer, the second wire layer comprising a first grounding portion and a plurality of first conductive pattern portions; and
      a second multilayer structure arranged on the second surface, the second multilayer structure comprising a third wire layer formed on the second surface, a second middle layer formed on the third wire layer, and a fourth wire layer formed on the second middle layer, the fourth wire layer comprising a second grounding portion and a plurality of second conductive pattern portions;
   a first chip electrically mounted on the first grounding portion and electrically connected to the first conductive pattern portions;
   a second chip electrically mounted on the second grounding portion and electrically connected to the second conductive pattern portions;
   a plurality of first wires and a plurality of second wires, wherein the first chip comprises a first top surface and a plurality of first chip pads formed on the first top surface, the second chip comprises a second top surface and a plurality of second chip pads formed on the second top surface, the first chip pads are connected to the respective first conductive pattern portions through the first wires, and the second chip pads are connected to the respective second conductive pattern portions through the second wires; and
   a first protective layer, a second protective layer, and a first cover glass, wherein the first protective layer covers the first wires, the jointed portions between the first wires and the corresponding first chip pads, and the jointed portions between the first wires and the corresponding first conductive pattern portions, the first top surface comprises a first exposed region among the first chip pads and being free of the first protective layer, the second protective layer covers the entire second chip, the second wires, and the jointed portions between the second wires and the corresponding second conductive pattern portions, the first cover glass is attached to the first protective layer and seals the first chip, and the first exposed region faces the first cover glass.

4. The double-sided printed circuit board as claimed in claim 3, wherein the first grounding portion and the second grounding portion are made of metal.

5. The double-sided printed circuit board as claimed in claim 3, wherein the first protective layer and the second protective layer are made of heat-curable resin.

6. A double-sided printed circuit board comprising:
   a circuit plate comprising:
      a spacer layer comprising a first surface and an opposing second surface;
      a first multilayer structure arranged on the first surface, the first multilayer structure comprising a first wire layer formed on the first surface, a first middle layer formed on the first wire layer, and a second wire layer formed on the first middle layer, the first wire layer being grounded, the first middle layer defining a first through hole, the second wire layer comprising a plurality of first conductive pattern portions around the first through hole; and
      a second multilayer structure arranged on the second surface, the second multilayer structure comprising a third wire layer formed on the second surface, a second middle layer formed on the third wire layer, and a fourth wire layer formed on the second middle layer, the third wire layer being grounded, the second middle layer defining a second through hole, the fourth wire layer comprising a plurality of second conductive pattern portions around the second through hole;
   a first chip received in the first through hole and electrically mounted on the first wire layer, the first chip electrically connected to the first conductive pattern portions;
   a second chip received in the second through hole and electrically mounted on the second wire layer, the second chip electrically connected to the second conductive pattern portions;
   a plurality of first wires and a plurality of second wires, wherein the first chip comprises a first top surface and a plurality of first chip pads formed on the first top surface, the second chip comprises a second top surface and a plurality of second chip pads formed on the second top surface, the first chip pads are connected to the respective first conductive pattern portions through the first wires, the second chip pads are connected to the respective second conductive pattern portions through the second wires, the top surface of the first multilayer structure is coplanar with the first top surface, and the top surface of the second multilayer structure is coplanar with the second top surface; and
   a first protective layer and a second protective layer, wherein the first protective layer covers the first wires, the jointed portions between the first wires and the corresponding first chip pads, and the jointed portions between the first wires and the corresponding first conductive pattern portions, the first top surface comprises a first exposed region among the first chip pads and being free of the first protective layer, the second protective layer covers the second wires, the jointed portions between the second wires and the corresponding second chip pads, and the jointed portions between the second wires and the corresponding second conductive pattern portions, and the second top surface comprises a second exposed region among the second chip pads and being free of the second protective layer.

7. The double-sided printed circuit board as claimed in claim 6, further comprising a first cover glass and a second cover glass, wherein the first cover glass is attached to the first protective layer and seals the first chip, the first exposed region faces the first cover glass, the second cover glass is attached to the second protective layer and seals the second chip, and the second exposed region faces the second cover glass.

* * * * *